(12) United States Patent
Chakravarthy

(10) Patent No.: US 6,535,057 B2
(45) Date of Patent: Mar. 18, 2003

(54) PROGRAMMABLE GLITCH FILTER

(75) Inventor: Kalyana Chakravarthy, Delhi (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 09/864,946

(22) Filed: May 24, 2001

(65) Prior Publication Data

US 2001/0048341 A1 Dec. 6, 2001

(30) Foreign Application Priority Data

May 29, 2000 (IN) ................................. 543/00

(51) Int. Cl.[7] ................................................ H03B 1/00
(52) U.S. Cl. ........................ 327/551; 327/311; 327/379; 326/28
(58) Field of Search ................................ 327/5, 31, 34, 327/36, 18, 20, 26, 161, 261, 551–553, 556, 292, 165, 166, 557, 155, 310, 311, 379, 384; 326/93, 26, 28; 365/206, 233.5

(56) References Cited

U.S. PATENT DOCUMENTS

| 4,464,784 A | * | 8/1984 | Agnello ........................ 381/61 |
| 5,289,060 A | | 2/1994 | Elnashar et al. ............. 327/552 |
| 5,731,715 A | * | 3/1998 | Mote, Jr. ....................... 326/93 |
| 6,075,392 A | * | 6/2000 | Sandner ....................... 327/145 |
| 6,265,919 B1 | * | 7/2001 | Guisante et al. ............. 327/150 |

FOREIGN PATENT DOCUMENTS

| JP | 4287512 | 10/1992 |

* cited by examiner

Primary Examiner—Timothy P. Callahan
Assistant Examiner—Minh Nguyen
(74) Attorney, Agent, or Firm—Lisa K. Jorgenson; Allen, Dyer, Doppelt, Milbrath & Gilchrist, P.A.

(57) ABSTRACT

A glitch filter includes a storage element for storing a current state, which is the output of the filter. An output of the storage element is-connected to one input of a state comparator. Another input of the state comparator is connected to an input signal. A programmable clock delay is connected between the state comparator and the storage element. The programmable clock delay may provide a programmed duration independent of the technology used for implementation. The glitch filter is arranged such that the input signal is stored as the new current state in the storage element only if the input signal changes and then remains unchanged for the programmed duration.

22 Claims, 19 Drawing Sheets

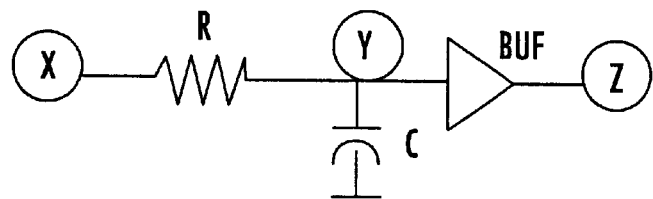
RC CIRCUIT
*FIG. 2A.*
*(PRIOR ART)*
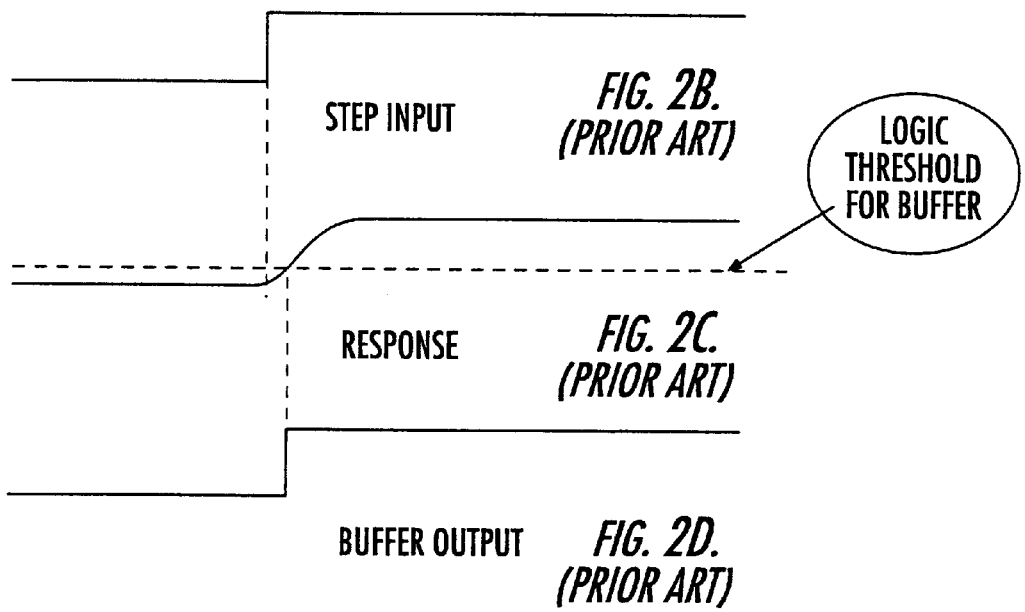
STEP INPUT    *FIG. 2B.*
*(PRIOR ART)*
LOGIC THRESHOLD FOR BUFFER
RESPONSE    *FIG. 2C.*
*(PRIOR ART)*
BUFFER OUTPUT    *FIG. 2D.*
*(PRIOR ART)*

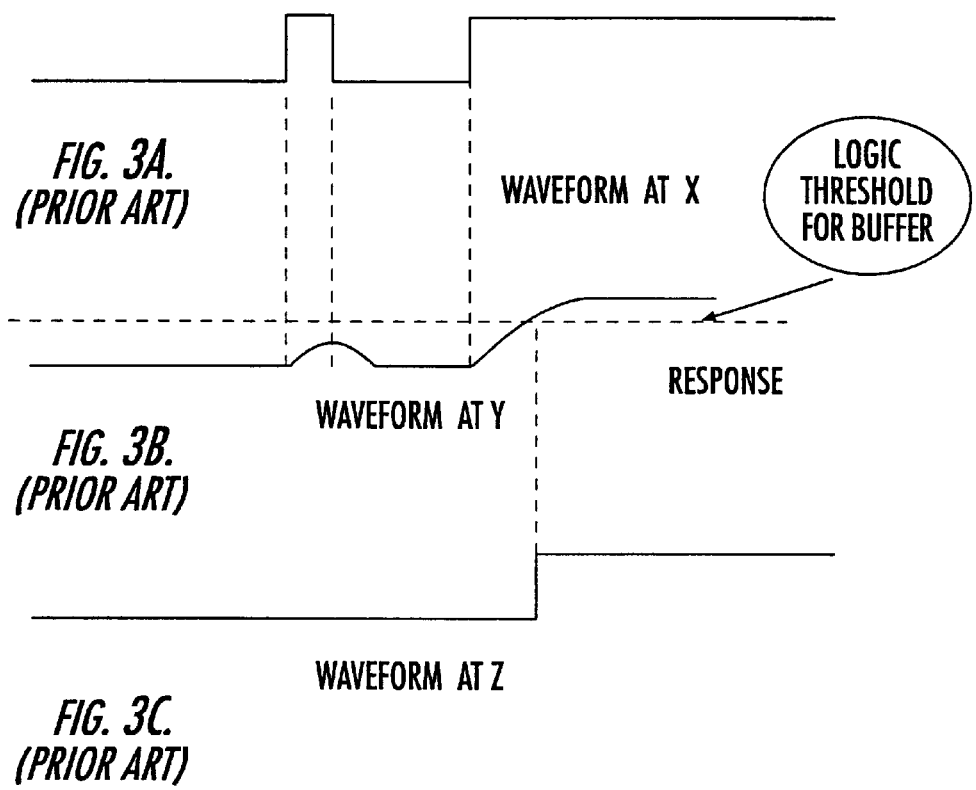

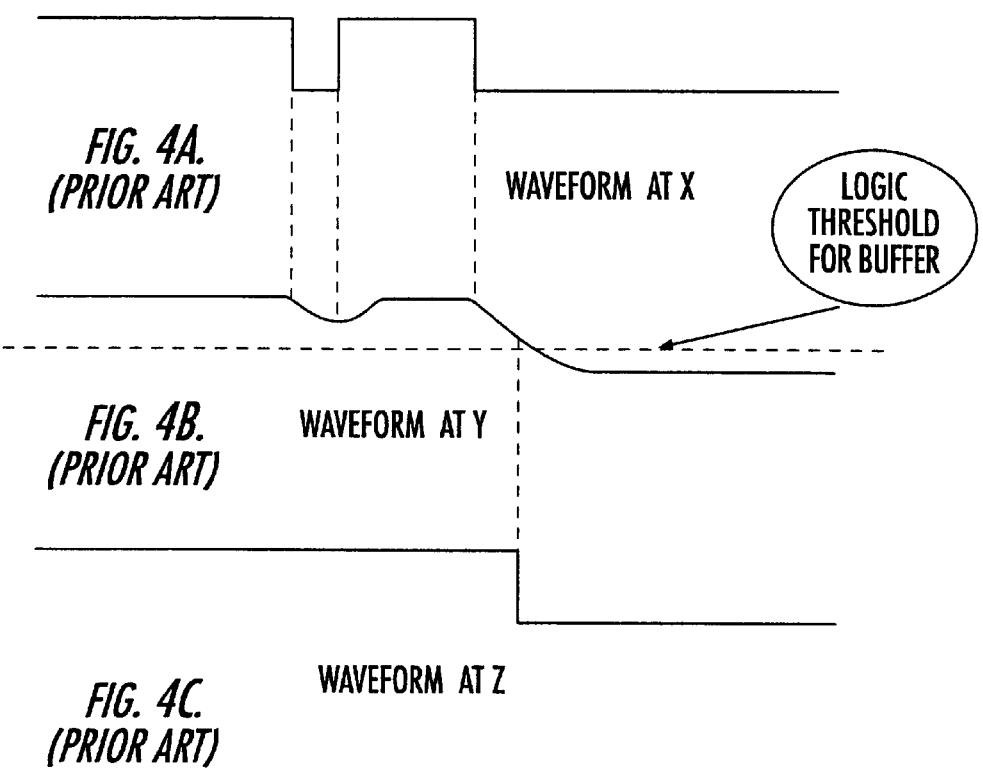
FIG. 4A. (PRIOR ART) WAVEFORM AT X — LOGIC THRESHOLD FOR BUFFER
FIG. 4B. (PRIOR ART) WAVEFORM AT Y
FIG. 4C. (PRIOR ART) WAVEFORM AT Z

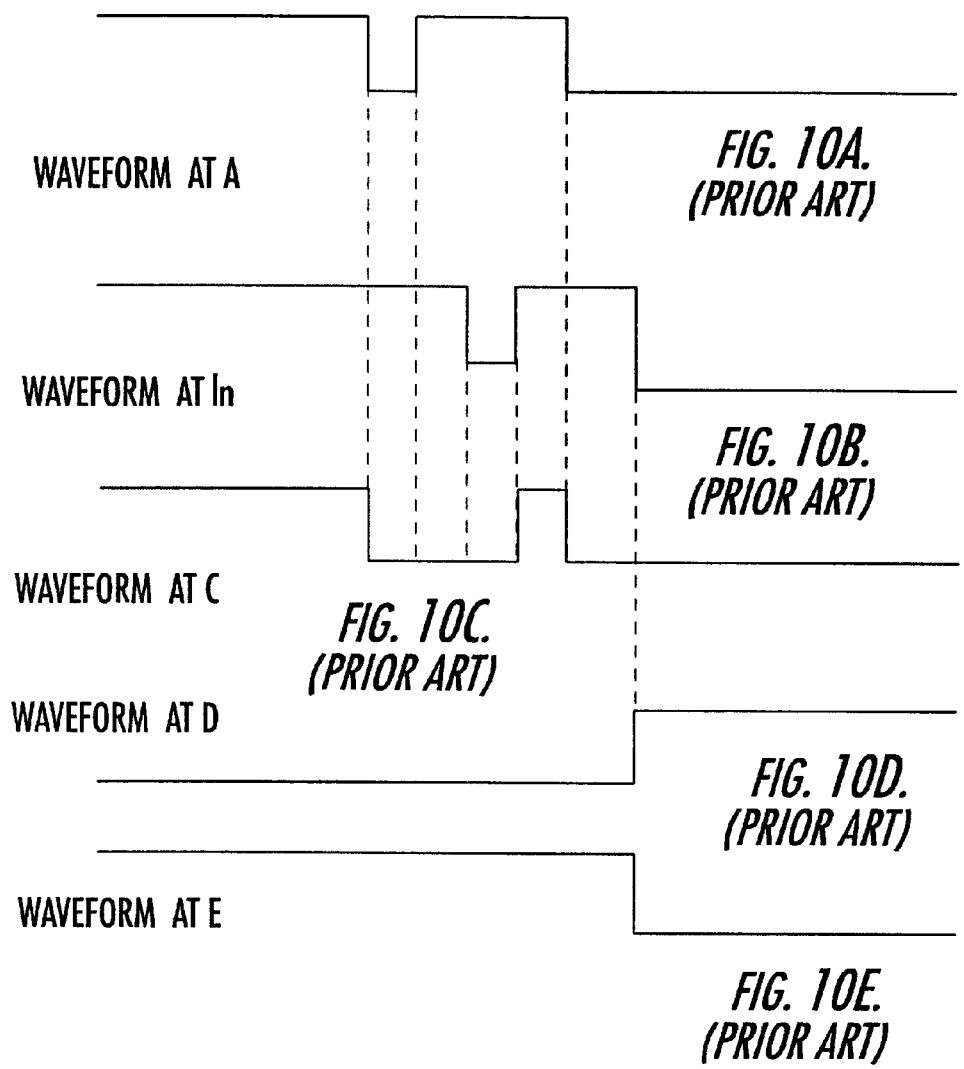

PROGRAMMABLE GLITCH FILTER

FIELD OF THE INVENTION

The present invention relates to electronic circuits, and, more particularly, to programmable glitch filters.

BACKGROUND OF THE INVENTION

Digital circuit designs use the binary signal levels logic 0 and logic 1. These signals may also be referred to as logic LOW and logic HIGH, respectively. A glitch is an unwanted transition in the logic level (either LOW or HIGH). This effects the performance of digital circuits since storage elements (e.g., flip-flops) change their logic state on either a LOW to HIGH or HIGH to LOW logic transition. A glitch is illustrated in FIG. 1.

The most conventional method of suppressing glitches in digital circuits on printed circuit boards (PCBs), for example, is by using an RC circuit. One example of a glitch suppression mechanism including an RC circuit is shown in FIG. 2A. The step input to the RC circuit (at point X) is shown in FIG. 2B. The response of the circuit is illustrated in FIG. 2C, and the waveform at the output of the buffer (at Z) is shown in FIG. 2D. When a step input (shown in FIG. 2B) is given to the RC circuit (at X of FIG. 2A), the response of the circuit (at Y, shown in FIG. 2C) can be mathematically represented by the following equation (1):

$$V_o = V_i (1-e^{-t/RC}), \tag{1}$$

where t is time in seconds, R is resistance in ohms and C is capacitance in farads.

The glitch suppression technique using an RC circuit can be employed both for positive and negative glitches. The glitch suppression mechanism for positive glitches is shown in FIGS. 3A to 3C, and the glitch suppression mechanism for negative glitches is shown in FIGS. 4A to 4C. The values of R and C are to be selected such that for maximum glitch width the response of the RC circuit does not cross the threshold of the buffer.

A waveform with positive glitch is shown in FIG. 3A. This waveform is input to the RC circuit (point X in FIG. 2A). The response of the RC circuit to the input waveform (at Y in FIG. 2A) is shown in FIG. 3B. The glitch free signal (at Z in FIG. 2A) is shown in FIG. 3C. A waveform with negative glitch is shown in FIG. 4A. This waveform is input to the RC circuit (point X in FIG. 2A). The response of the RC circuit to the input waveform (at Y in FIG. 2A) is shown in FIG. 3B. The glitch free signal (at Z in FIG. 2A) is shown in FIG. 4C.

Glitch suppression by delay elements is the most widely used glitch suppression for application specific integrated circuit (ASIC) applications. A large number of patents exist on glitch suppression using delay elements. A typical glitch suppression mechanism is discussed below with reference to figures from Japanese patent No. 4,287,512. The glitch suppression mechanism for positive glitches disclosed in the patent is shown in FIGS. 6A to 6E. The glitch suppression mechanism for negative glitches is shown in FIGS. 7A to 7E.

This prior art circuit essentially uses an SR (Set-Reset) flip-flop. The SR flip-flop is realized using two NAND gates NAND1 and NAND2. The component DELBUF acts as a delay buffer. The delay buffer delays the input signal (signal at A in FIG. 5) by a fixed amount. The delay buffer is selected such that the delay inserted by it is equal to a maximum glitch width that is to be suppressed.

FIG. 6A shows a waveform having a positive glitch. FIG. 6B shows the output of the delay buffer. The waveforms at the S and R inputs of the SR flip-flop are shown in FIGS. 6C and 6D, respectively. The output glitch free waveform is shown in FIG. 6E. FIG. 7A shows a waveform having a negative glitch. FIG. 7B shows the output of the delay buffer. The waveforms at the S and R inputs of the SR flip-flop are shown in FIGS. 7C and 7D respectively. The output glitch free waveform is shown in FIG. 7E.

A prior art programmable glitch filter from U.S. Pat. No. 5,289,060 is shown in FIG. 8. The filter includes an SR flip-flop. The output of the flip-flop Q is set to logic 1 only when S is 1 and R is 0. Q is set to logic 0 only when S is at 0 and R is at 1. When S and R are at 0, the same logic state is maintained. A logic 1 on S and R is not allowed.

A programmable delay buffer (represented as "PROGRAMMABLE DELAY" in FIG. 8) provides a delay which is programmable-to a pre-determined value. This block delays the input signal at A to a programmable value. The incrementally delayed outputs of the programmable delay are fed to the AND gate and the bubbled AND gate (BAND) (the inputs of this logic element are first inverted and then logically ANDed). The output of the AND gate is 1 only when all the inputs are at logic 1. The output of the BAND gate is at logic 1 only when all the inputs are at logic 0.

The glitch suppression mechanism for positive pulses is shown in FIGS. 9A to 9E. FIG. 9A shows the waveform having positive glitches. FIG. 9B shows the waveform after maximum programmed delay at In. The output of the AND gate is shown in FIG. 9C, and the output of the BAND gate is shown in FIG. 9D. The glitch free output present at Q of SR flip-flop is shown in FIG. 9E.

The glitch suppression mechanism for negative pulses is shown in FIGS. 10A to 10E. FIG. 10A shows the waveform having negative glitches. FIG. 10B shows the waveform after a maximum programmed delay at In. The output of the AND gate is shown in FIG. 10C, and the output of the BAND gate is shown in FIG. 10D. The glitch free output present at Q of the SR flip-flop is shown in FIG. 10E.

The above prior art devices all use a delay element to delay the signal. The delay signal and the original signal are compared. The output of the glitch filter is assigned to the input only when both the inputs have same value. The delay elements are implemented using buffers, and the existing glitch suppression techniques work fine for glitches of small pulse widths (i.e., tens of ns). Yet, if the glitch width is on the order of a few hundreds of microseconds or a few milliseconds, glitch suppression using the above techniques become very difficult. This is mainly because implementing a delay element to delay the signal by a few hundred microseconds may be very difficult.

SUMMARY OF THE INVENTION

An object of this invention is to obviate the above drawbacks and provide a programmable glitch filter which can suppress glitch width on the order of a few hundred microseconds or a few milliseconds.

This and other objects, features and advantages of the invention are provided by a glitch filter including storage means for storing a current state, which is the output of the filter. The output of the storage means is connected to one input of a state comparator, and the other input of the state comparator is connected to the input signal. A programmable clock delay means, which may provide a required duration independent of the technology of implementation, is connected between the state comparator and the storage means. The arrangement of the glitch filter may be such that the input signal is stored as the new current state in the storage means only if the input signal changes and then remains unchanged for the programmed duration.

The means for providing a programmable clock delay may include a counter for counting clock pulses to provide a time delay. A control input of the counter may be connected to the output of the state comparator. Further, an output of the counter may be connected to one input of a digital delay comparator. The other input of the delay comparator may receive a digital value corresponding to the maximum glitch width to be filtered. Also, an output of the delay comparator may be connected to the input of the storage means. The counter may be enabled if the input to the glitch filter is not equal to the output of the storage means, and the counter may be initialized when the input of the glitch filter is equal to the output of the storage means.

A multiplexer may be provided at the output of the storage means which also receives the input signal at an input thereof and the programmable digital value for the desired maximum glitch width at its control input. An arrangement of the multiplexer is such that when the programmed digital value is zero, the input signal is fed to the output of the multiplexer. Also, when the value is not zero, the storage means output is fed to the output of the multiplexer. The number of bits used for the counter and the digital delay comparator depends upon the desired range of programmable digital values necessary for maximum glitch width.

A method aspect of the invention for filtering glitches includes storing a current state, which is the final output, and comparing the current state with the input signal. Further, a programmable delay is enabled whenever the input signal is different from the stored current state, and the programmable delay is initialized whenever the input signal is the same as the stored current state. The method may also include making the stored current state equal to the input signal if the programmed delay is complete.

More specifically, the programmable delay may be obtained by counting clock pulses, comparing the counted clock pulses with a digital value corresponding to the maximum glitch width, and generating a signal indicating completion of programmed delay when the counted clock pulses become equal to the digital value. The counting may be enabled only if the input signal is not equal to the stored output state, and counting may be initialized whenever the input signal is equal to the stored output state. Also, the filtering of glitches may be enabled when the digital value for desired glitch width is non-zero, and it may be disabled when the digital value is zero.

BRIEF DESCRIPTION OF THE DRAWINGS

The invention will now be described with reference to the accompanying drawings, in which:

FIG. 2A is a schematic diagram of a conventional RC circuit for suppressing glitches according to the prior art;

FIGS. 2B, 2C and 2D are timing diagrams showing the step input in the RC circuit of FIG. 2A, response of the RC circuit and the waveform at the output of the buffer, respectively;

FIGS. 3A to 3C are timing diagrams showing glitch suppression mechanisms for positive glitches for the RC circuit of FIG. 2A;

FIGS. 4A to 4C are timing diagrams showing the glitch suppression mechanism for negative glitches for the RC circuit of FIG. 2A;

FIGS. 10A to 10E are timing diagrams illustrating the glitch suppression mechanism for negative pulses of the programmable glitch filter of FIG. 8;

DETAILED DESCRIPTION OF THE PREFERRED EMBODIMENTS

Figure 1:
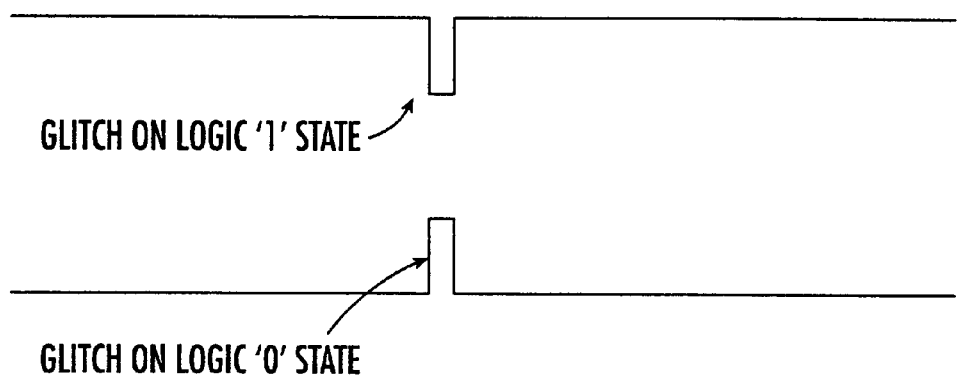
FIG. 1 is a timing diagram illustrating a glitch.
Figure 5:
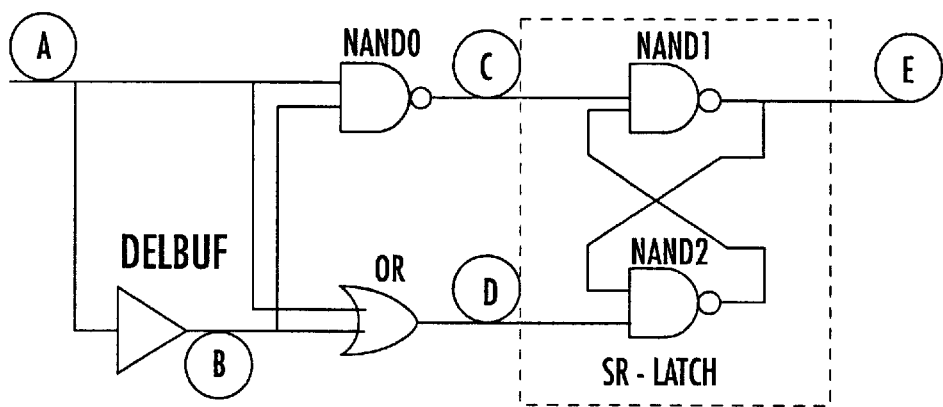
FIG. 5 is a schematic diagram of a prior art glitch suppression device described in Japanese Patent No. 4,287,512 using delay elements for an ASIC application.
Figure 6:
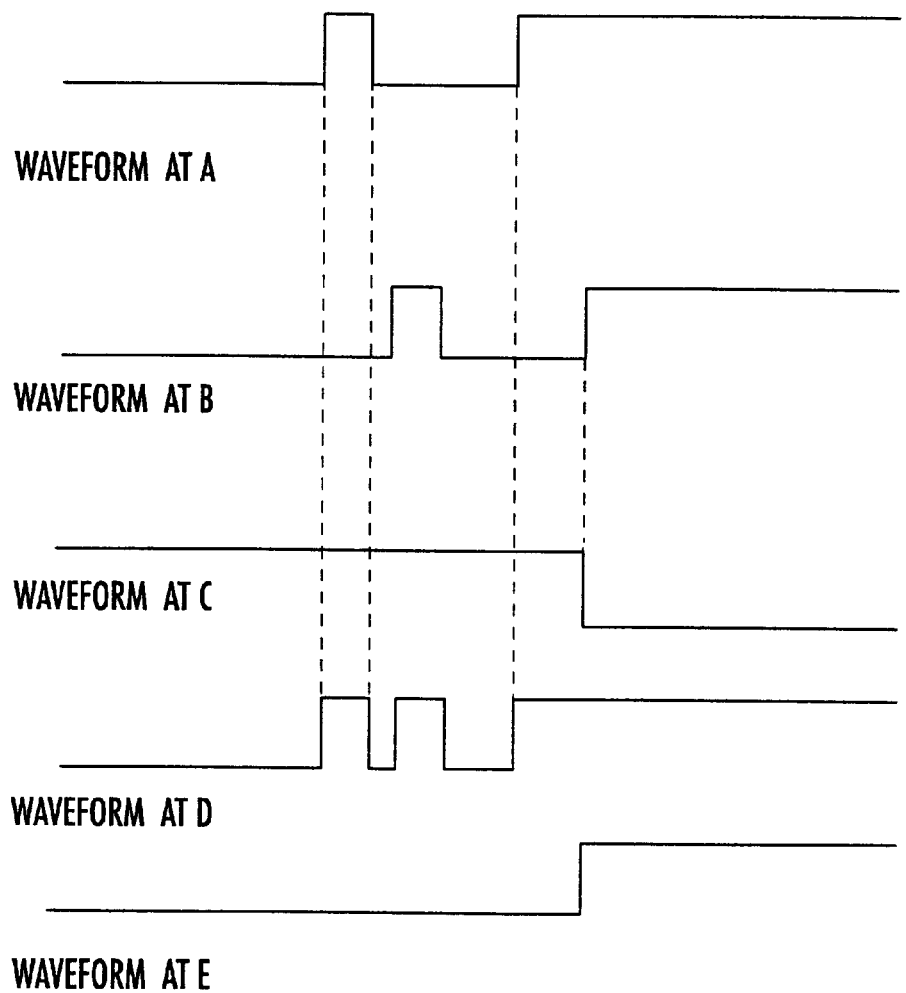
FIGS. 6A to 6E are timing diagrams showing the glitch suppression mechanism for positive glitches for the ASIC application of FIG. 5.
Figure 7:
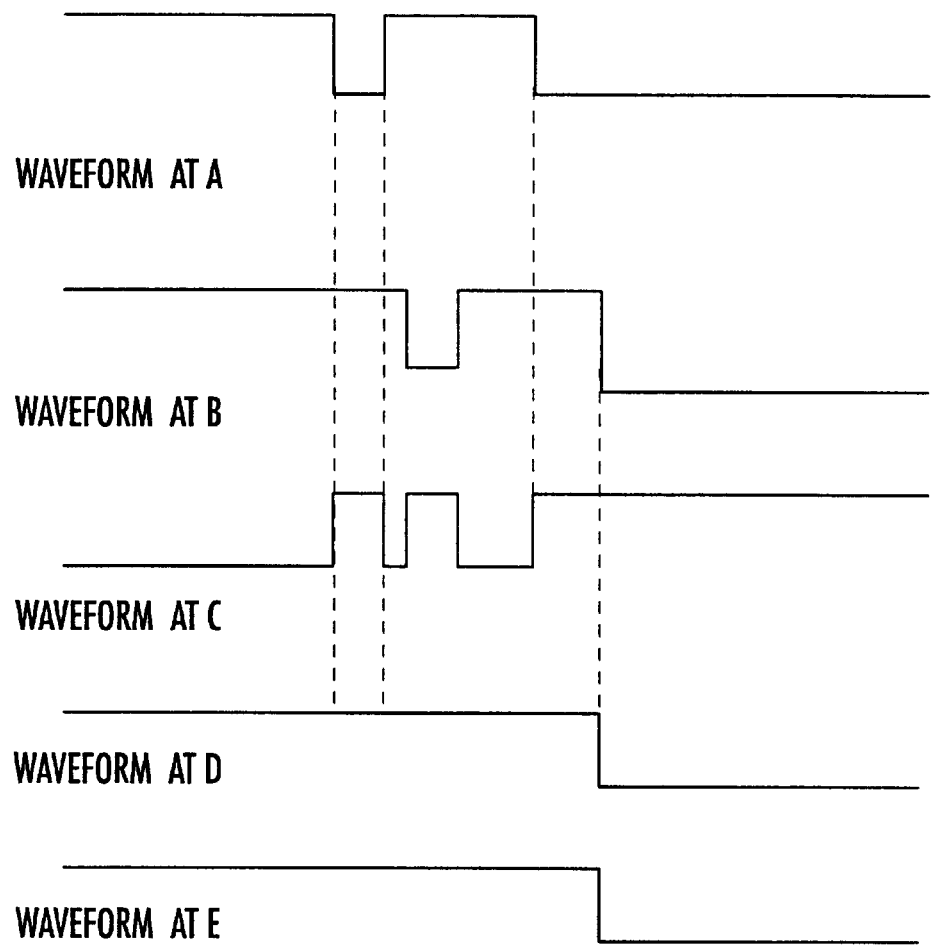
FIGS. 7A to 7E are timing diagrams illustrating the glitch suppression mechanism for negative glitches for the ASIC application of FIG. 5.
Figure 8:
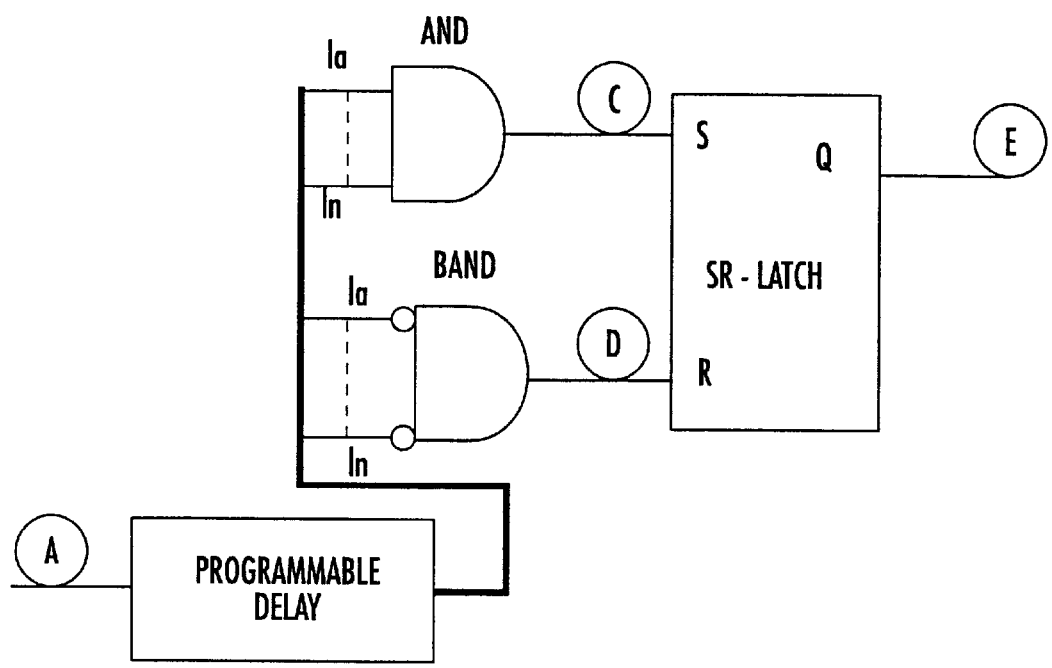
FIG. 8 is a schematic diagram showing a prior art programmable glitch filter described in U.S. Pat. No. 5,289,060.
Figures 9A, 9B, 9C, 9D, 9E:
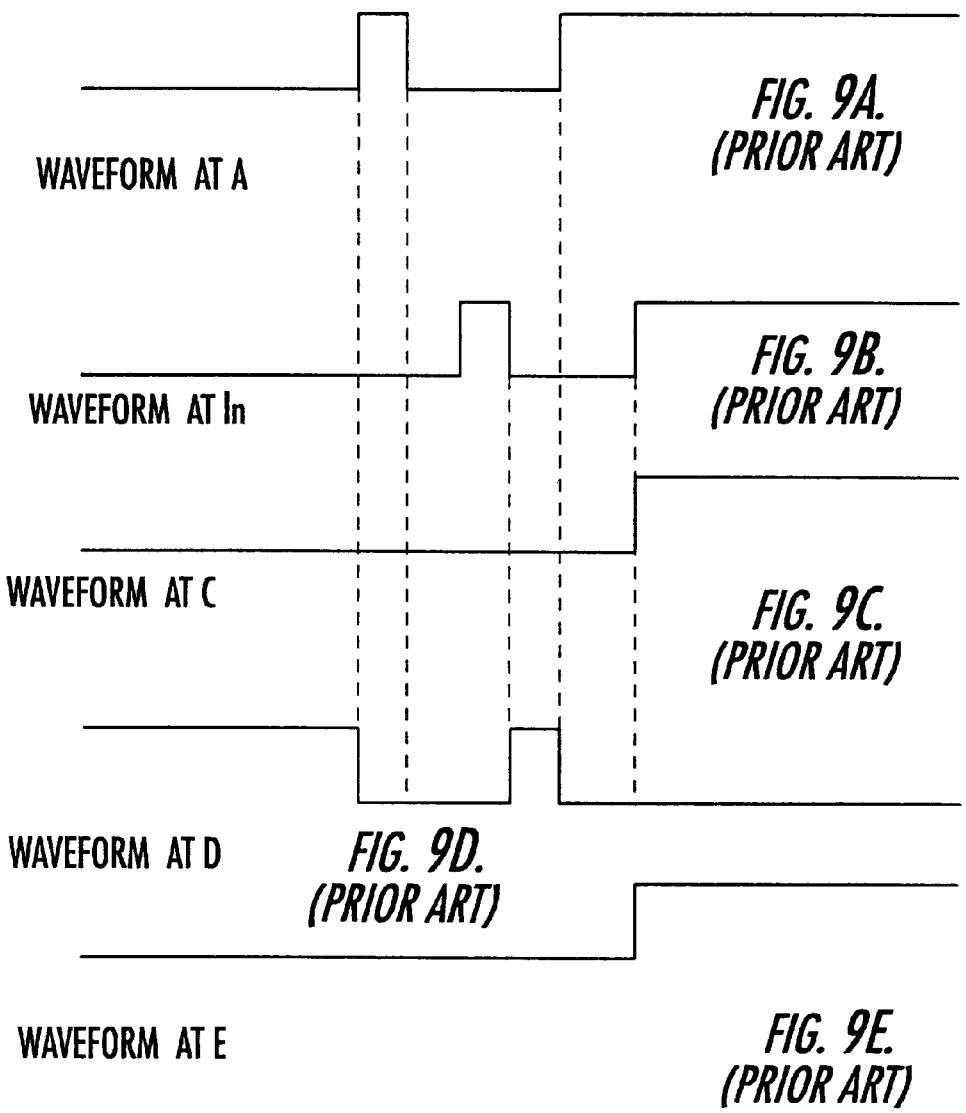
FIGS. 9A to 9E are timing diagrams showing the glitch suppression mechanism for positive pulses of the programmable glitch filter of FIG. 8.
Figure 11:
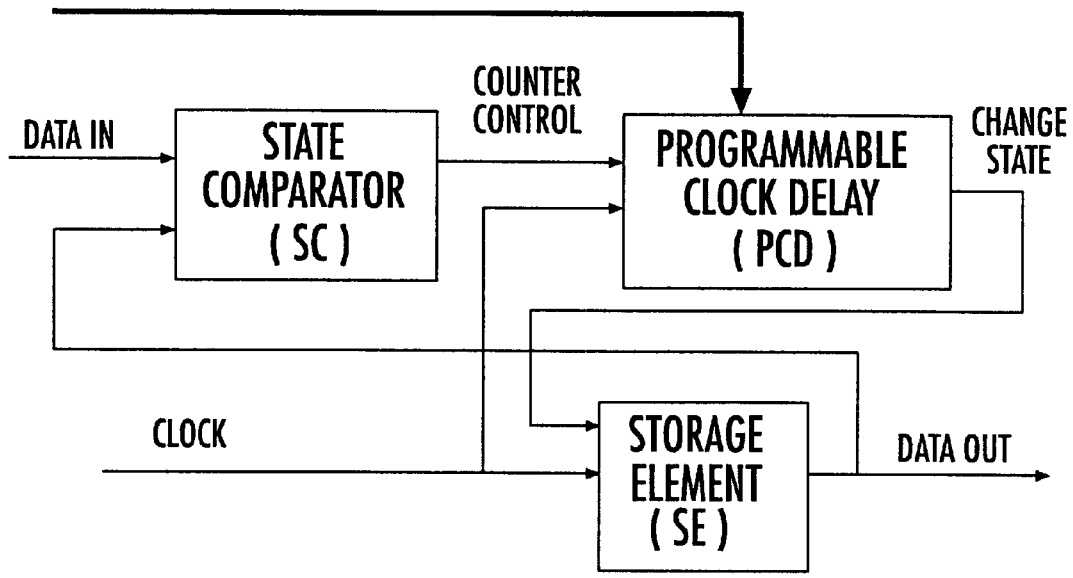
FIG. 11 is a schematic block diagram of a programmable glitch filter according to the invention.

As noted above, FIGS. 1 to 10E describe prior art devices and techniques. The present invention will now be explained more fully with reference to FIGS. 11 to 17. Referring to FIG. 11, a state comparator (SC) receives the input signal at one input. It also receives the current output state from the output of a storage element (SE) at its other input. Whenever the input signal is different from the current stored state, the output of the state comparator (SC) activates a counter control signal to enable a programmable clock delay circuit (PCD). The programmable clock delay circuit (PCD) begins counting clock pulses received at its clock input.

The programmable clock delay circuit (PCD) also receives a required value of maximum glitch width at its program input. If the counter control signal remains active for a number of clock pulses equal to the required value of maximum glitch width, the change state output from the programmable clock delay circuit (PCD) is activated. This causes the storage element (SE) to change its state to the value of the input signal, which also changes the output of the filter.

At this point the current stored state becomes equal to the input signal, which causes state comparator (SC) to deactivate the counter control and thereby initialize the programmable delay circuit (PCD). If the input signal does not remain stable for the duration of the number of clock pulses equal to the required value of maximum glitch width, the counter control is deactivated by the state comparator (SC). This is done to initialize the programmable clock delay circuit (PCD) before the change state output can become active. Hence, a glitch (which is a change of state before the programmed value of delay) will not cause the storage element (SE) to change its state and, therefore, the output remains the same.

Figure 12:
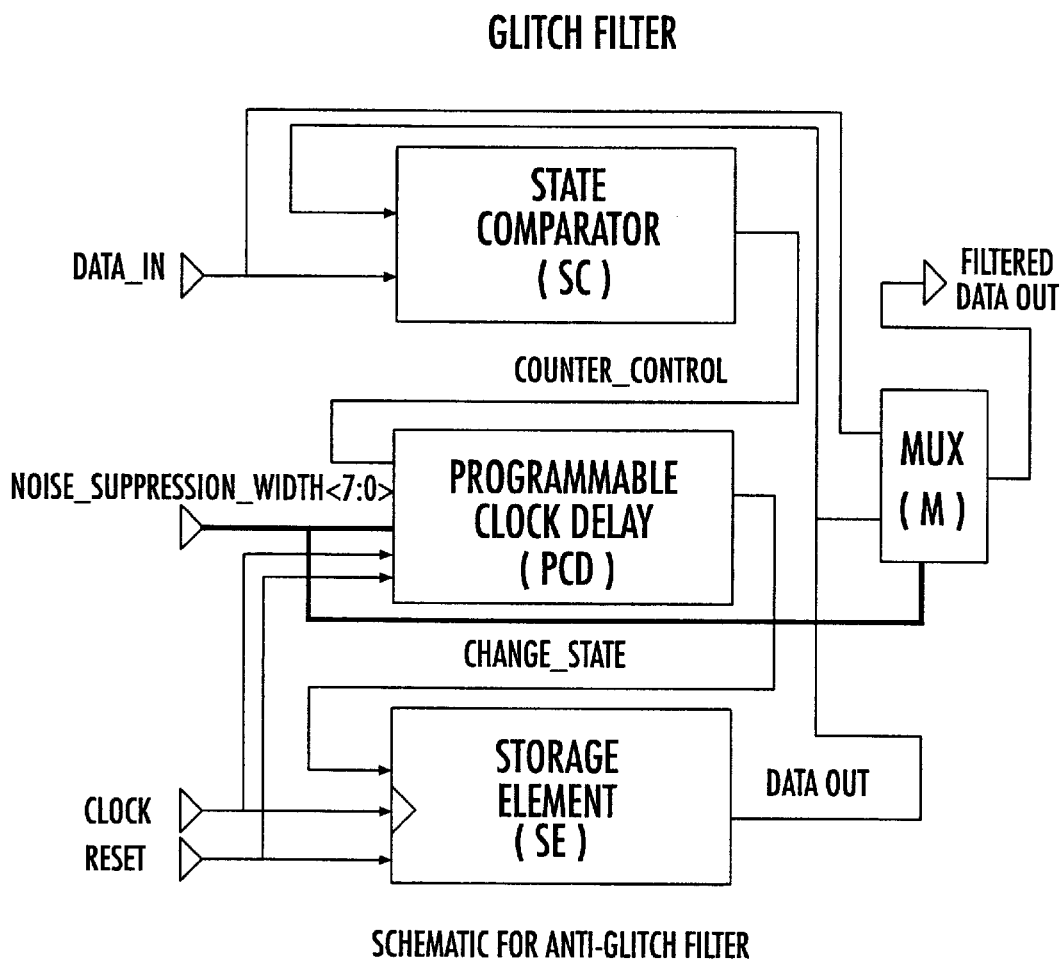
FIG. 12 is a schematic block diagram showing the programmable glitch filter of FIG. 11 in further detail.

Turning now to FIG. 12, a multiplexer (M) is added at the output of the storage element (SE). The multiplexer (M) receives the output of the storage element (SE) at one of its inputs while the other input receives the input signal. The control input of the multiplexer (M) is connected to the desired value of maximum glitch width. If the desired value of the maximum glitch width is zero, the multiplexer (M) connects the input signal directly to the output of the filter, thereby suppressing the glitch filtering. If, however, the maximum glitch width value is not zero, the multiplexer (M) connects the output of storage element (SE) to the output of the filter and thereby enables the filtering operation.

Figure 13:
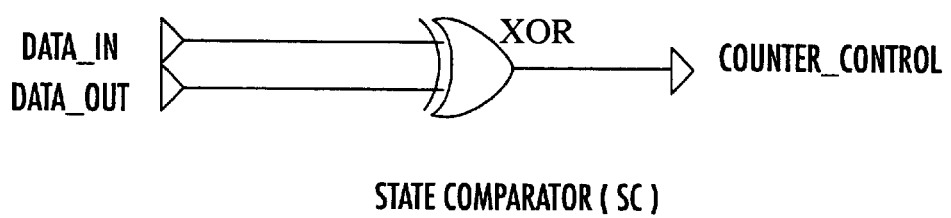
FIG. 13 is a schematic diagram showing the state comparator of FIG. 11 in further detail.

The state comparator (SC) is shown more particularly in FIG. 13. This circuit is a simple two-input exclusive-or gate (XOR) which receives the input signal and the stored current state at its two inputs. The exclusive-OR gate (XOR) generates the counter control signal at its output whenever the two inputs are unequal.

Figure 14:
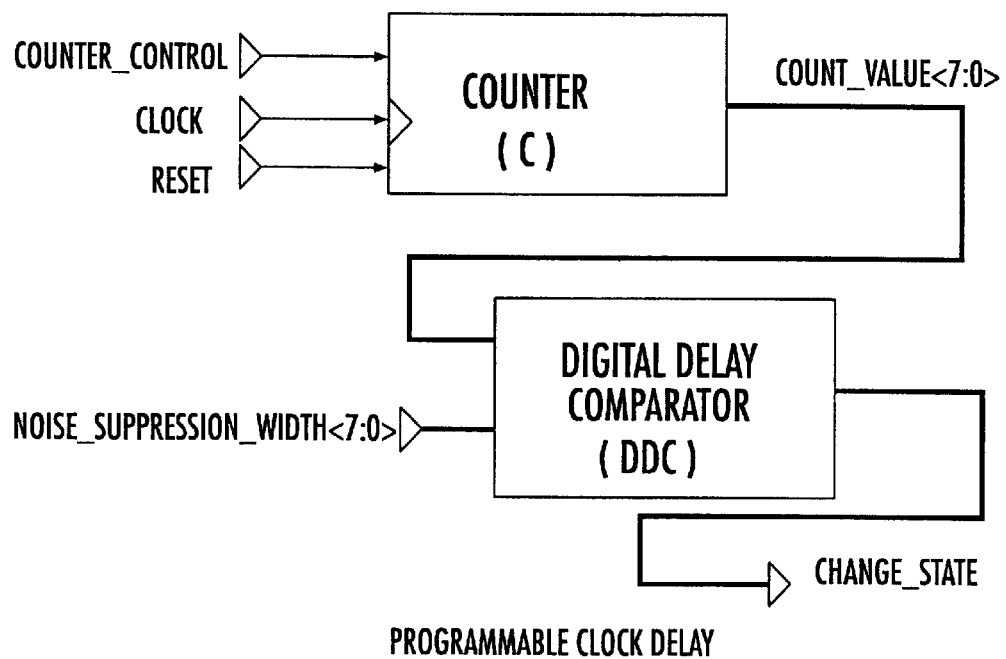
FIG. 14 is a schematic diagram showing the programmable clock delay of FIG. 11 in further detail.

Referring now to FIG. 14, the internal structure of the programmable clock delay circuit (PCD) is shown. A digital counter (C) receives the counter control signal at its enable input, a clock signal at its clock input, and a reset signal at its reset input. The digital value representing the current count value of the counter is connected to one input of a digital delay comparator (DDC). Further, the digital value corresponding to the clock count for the desired maximum glitch width is received at the other input of the digital delay comparator (DDC). The counter control signal is then activated, and the counter is enabled and counts clock pulses received at its clock input. When the count value becomes equal to the corresponding count for desired maximum glitch width, the digital delay comparator (DDC) activates the change state signal.

Figure 15:
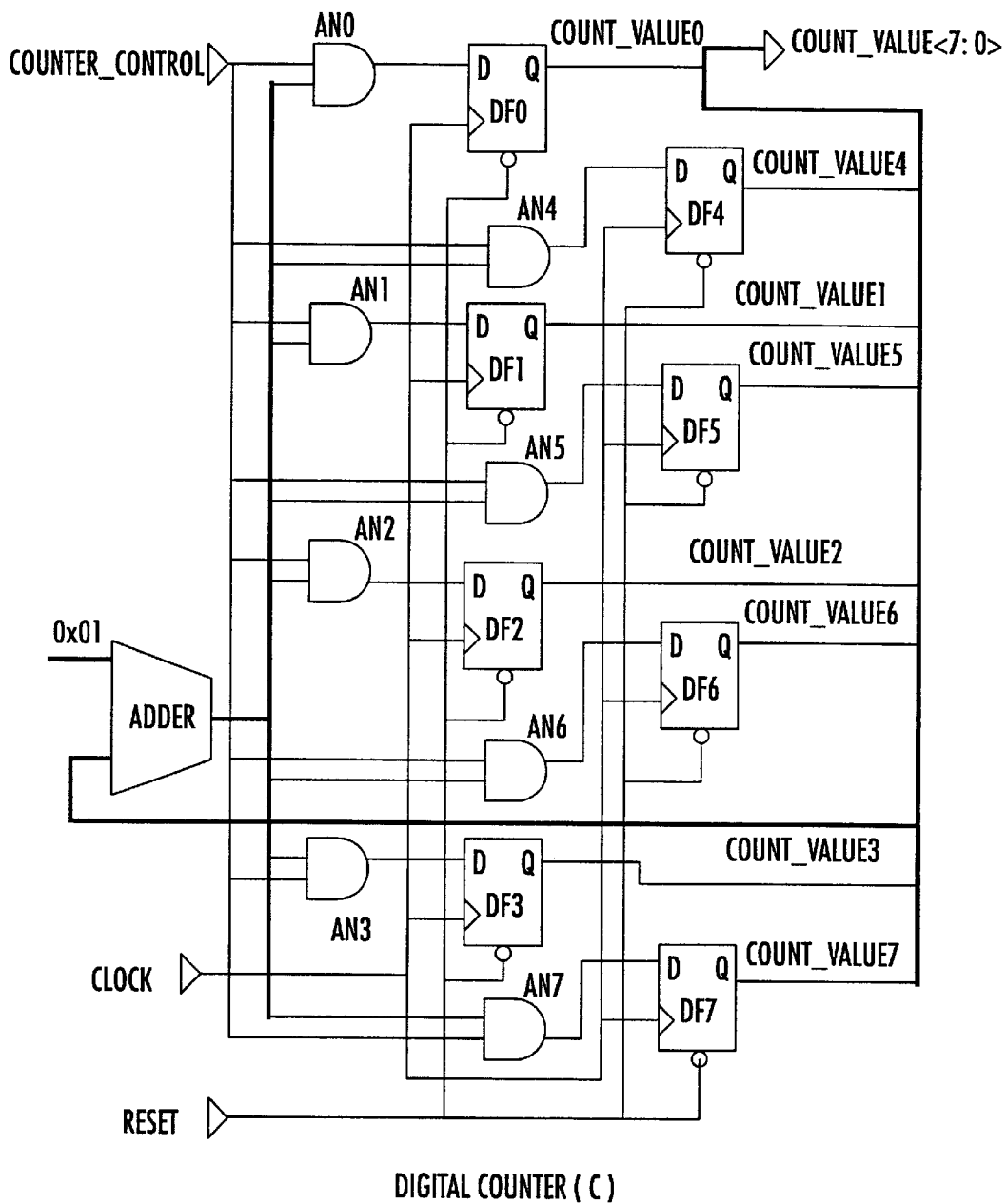
FIG. 15 is a schematic diagram showing the counter of FIG. 14 in further detail.

The internal structure of the digital counter (C) is further illustrated in FIG. 15. When counter_control is at logic 0, the output of AND gates AN0 to AN7 is at logic 0 and count_value is loaded with 0x00 on every rising clock edge. When counter_control is at logic 1, the output of the adder ADDER is shifted into the into D flip-flops DF0 to DF7 on every rising clock edge. The adder increments the current count_value by one. This is done by feeding the count value and 0x01 to the inputs of the adder. The count value +1 is assigned to the count value on every rising clock edge. Hence, the counter increments the count value on every rising clock edge when counter_control is at logic 1, and count_value is loaded with 0x00 on every rising clock edge when counter_control is at logic 0.

Figure 16:
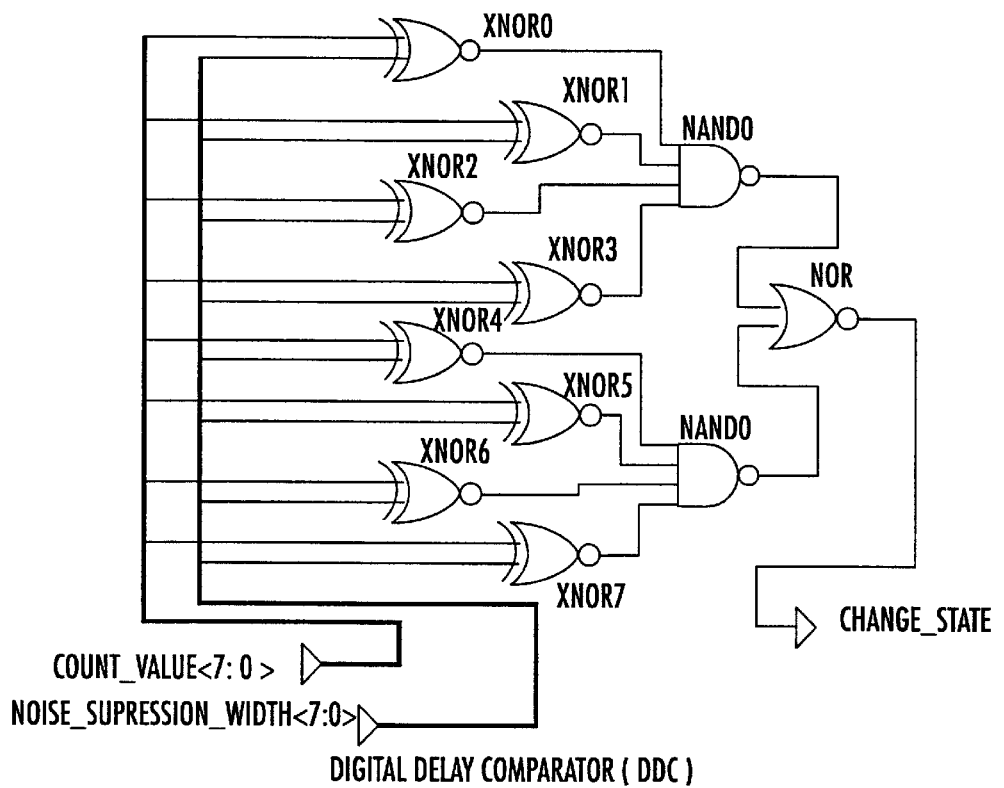
FIG. 16 is a schematic diagram showing the digital delay comparator of FIG. 14 in further detail.
Figure 17:
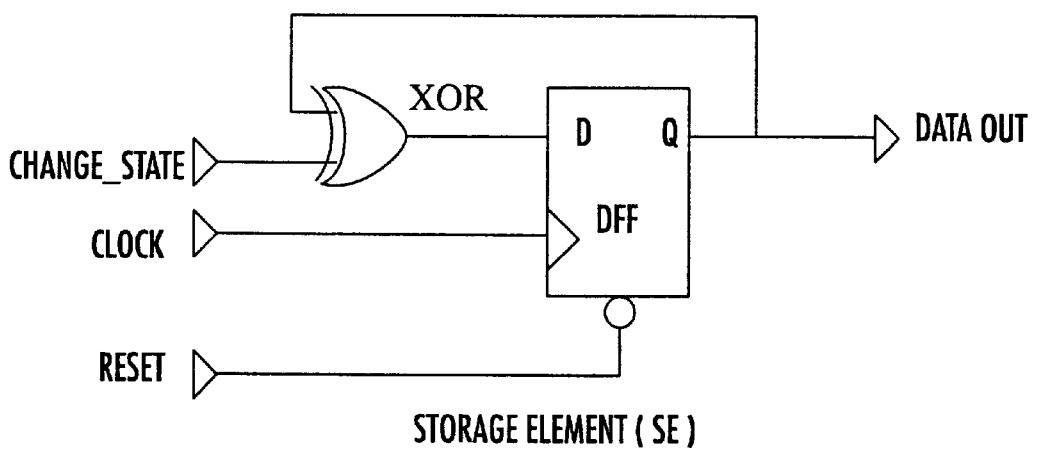
FIG. 17 is a schematic diagram showing the storage element of FIG. 11 in further detail.

The internal structure of the digital delay comparator (DDC) is shown in FIG. 16. The bit 0 of count_value and noise_suppression_width is fed to XNOR0, bit 1 to XNOR1, and so on. Change_state is at logic 1 only when count_value and noise_suppression_width are equal. Otherwise, it is at logic 0. Furthermore, the internal structure of the storage element (SE) is shown in FIG. 17. The output of DFF toggles on rising clock edges only when change_state is at logic 1. Otherwise, the same logic state is maintained at the output of DFF.

Figure 18:
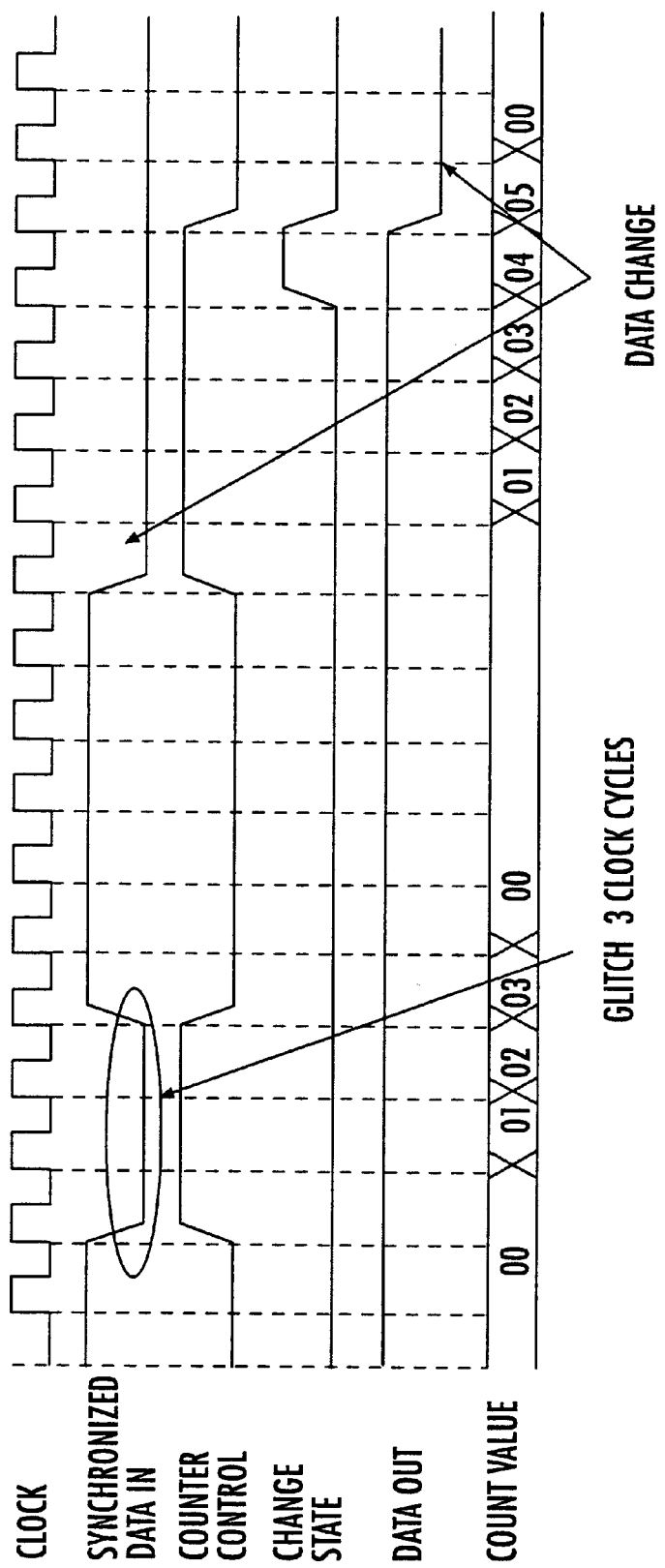
FIG. 18 is a timing diagram illustration operation the programmable glitch filter of FIG. 11 for positive glitches.

Operation of the programmable glitch suppression filter is shown in FIG. 18. In the example, the value of noise suppression width is assumed to be 4, which suppresses a glitch whose maximum width is 5 clock cycles. When there is a glitch of 3 clock cycles, counter_control is HIGH for three cycles and the count is counted up to a value of 3. When the glitch disappears, counter_control goes to logic 0 and count_value is loaded with 0. The output state remains unchanged.

Figure 19:
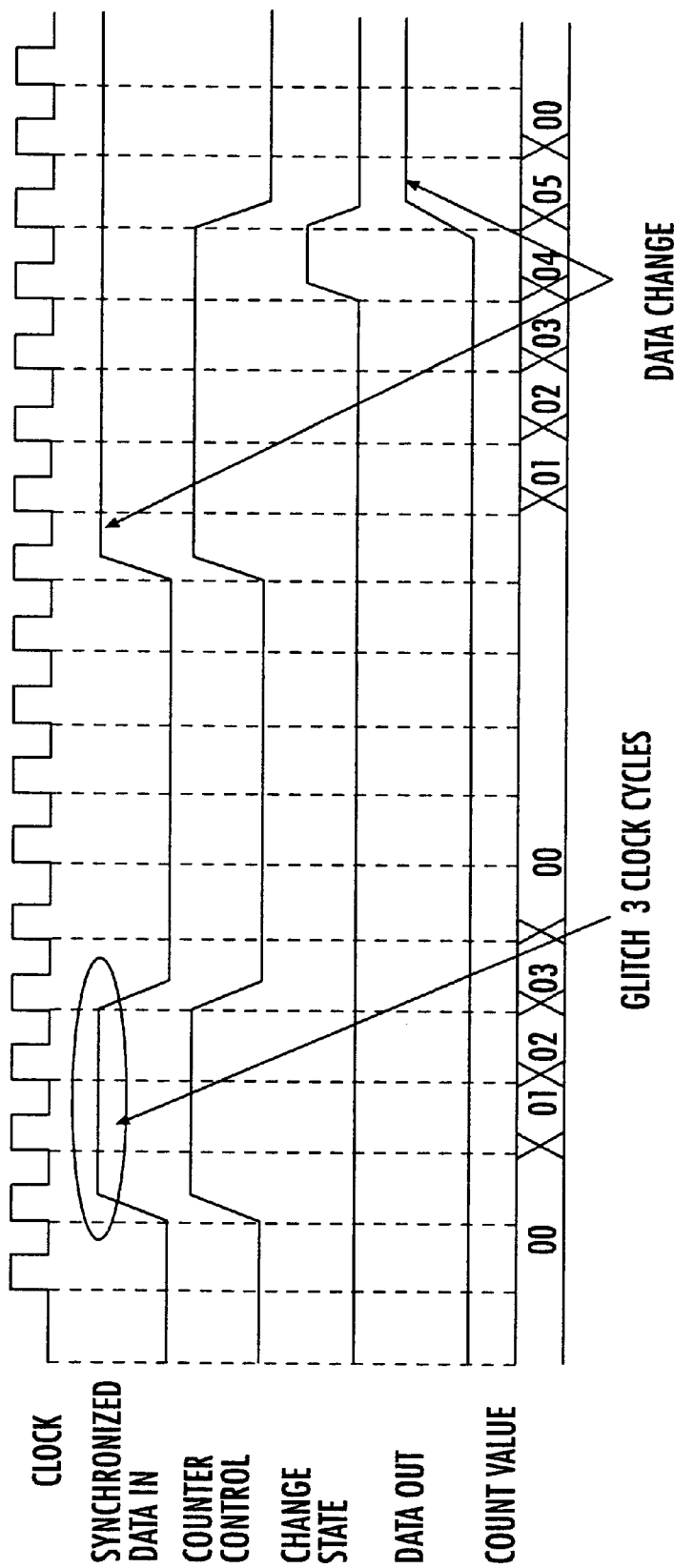
FIG. 19 is a timing diagram illustrating operation the programmable glitch filter of FIG. 11 for positive glitches.

When the data changes (for the second time in FIG. 18), counter_control goes to logic 1. Count_value increments on every rising clock edge. When the count_value reaches 4, change_state is also forced to logic 1. This toggles the logic state of data_out. Data_out now changes to logic 0. Since the logic state on data_in and data_out is the same, counter_control is forced to logic 0 and the counter_value is loaded with 0 on every rising clock edge. An example for a negative glitch may be seen in FIG. 19, in which the circuit operates exactly the same way as for positive glitch, described above.

It may be noted that the programmable glitch. filter functions as follows. The filter requires a fast clock (typically at least 5 times faster than the signal transitions, for example). When the filter is initialized or turned on, power on all the internal variables counter_control, change_state, and data_out are set to zero. To enable the filtering, noise_suppression_width <7:0> (which is a binary data bus) must have a value other than zero.

When noise_suppression_width <7:0> is zero, data_in is fed to filtered_data_out and filtering is disabled. The storage element has a state machine inside it which changes the logic state of data_out only when change_state is 1. The programmable delay is enabled only when counter_control is at logic 1. If the counter_control is at logic 0, the programmable delay is initialized on every rising clock edge.

The change_state signal is forced to logic 1 only when the logic state on the input signal remains different from the state of data_out for a time which is equal to that held in noise_suppression_width<7:0>. Counter_control is at logic 1 only when the logic state on data_in and data_out is different. Otherwise, it is 0. The data input to the filter should be synchronous to the system clock. The asynchronous data is to be synchronized before being fed to this module.

That which is claimed is:

1. A glitch filter comprising:
   storage means having an input for receiving a current state to be stored and an output for providing the current state as an output of the glitch filter;
   a state comparator having a first input connected to the output of said storage means, a second input connected to an input signal, and an output; and
   programmable clock delay means connected between the output of said state comparator and the input of said storage means, said programmable clock delay means providing a programmable delay so that the input signal is stored as a new current state in said storage means only if the input signal changes and then remains unchanged for the programmable delay.

2. The glitch filter according to claim 1 wherein said programmable clock delay means comprise:
   a counter having a control input connected to the output of said state comparator and an output, said counter counting clock pulses to provide a time delay; and
   a digital delay comparator having a first input connected to the output of said counter, a second input receiving a programmable digital value corresponding to a maximum glitch width to be filtered, and an output connected to the input of said storage means.

3. The glitch filter according to claim 2 wherein said counter is enabled only if the input signal is not equal to the current state output by said storage means; and wherein said counter is initialized when the input signal is equal to the current state output by said storage means.

4. The glitch filter according to claim 2 wherein a number of bits used for said counter and said digital delay comparator is based upon a range of the maximum glitch width.

5. The glitch filter according to claim 2 further comprising a multiplexer having a first input receiving the current state output by said storage means, a second input receiving the input signal, and a control input receiving the programmable digital value; wherein if the programmable digital value is zero, the input signal is provided at the output of the multiplexer; and wherein if the programmable digital value is not zero, the current value output by said storage means is provided at the output of said multiplexer.

6. The glitch filter according to claim 1 wherein the programmable delay is independent of a technology used to implement the glitch filter.

7. A glitch filter comprising:
    a storage element having an input for receiving a current state to be stored and an output for providing the current state as an output of the glitch filter;
    a state comparator having a first input connected to the output of said storage element, a second input connected to an input signal, and an output; and
    a programmable clock delay circuit connected between the output of said state comparator and the input of said storage element, said programmable clock delay providing a programmable delay so that the input signal is stored as a new current state in said storage element only if the input signal changes and then remains unchanged for the programmable delay.

8. The glitch filter according to claim 7 wherein said programmable clock delay circuit comprises:
    a counter having a control input connected to the output of said state comparator and an output, said counter counting clock pulses to provide a time delay; and
    a digital delay comparator having a first input connected to the output of said counter, a second input receiving a programmable digital value corresponding to a maximum glitch width to be filtered, and an output connected to the input of said storage element.

9. The glitch filter according to claim 8 wherein said counter is enabled only if the input signal is not equal to the current state output by said storage element; and wherein said counter is initialized when the input signal is equal to the current state output by said storage element.

10. The glitch filter according to claim 8 wherein a number of bits used for said counter and said digital delay comparator is based upon a range of the maximum glitch width.

11. The glitch filter according to claim 8 further comprising a multiplexer having a first input receiving the current state output by said storage element, a second input receiving the input signal, and a control input receiving the programmable digital value; wherein if the programmable digital value is zero, the input signal is provided at the output of the multiplexer; and wherein if the programmable digital value is not zero, the current value output by said storage element is provided at the output of said multiplexer.

12. The glitch filter according to claim 7 wherein the programmable delay is independent of a technology used to implement the glitch filter.

13. A glitch filter comprising:
    a storage element having an input for receiving a current state to be stored and an output for providing the current state as an output of the glitch filter;
    a state comparator having a first input connected to the output of said storage element, a second input connected to an input signal, and an output;
    a programmable clock delay circuit comprising
        a counter having a control input connected to the output of said state comparator and an output, said counter counting clock pulses to provide a time delay, and
        a digital delay comparator having a first input connected to the output of said counter, a second input receiving a programmable digital value defining a programmable delay and corresponding to a maximum glitch width to be filtered, and an output connected to the input of said storage element; and
    a multiplexer having a first input receiving the current state output by said storage element, a second input receiving the input signal, and a control input receiving the programmable digital value;
    the input signal being stored as a new current state in said storage element only if the input signal changes and then remains unchanged for the programmable delay.

14. The glitch filter according to claim 13 wherein said counter is enabled only if the input signal is not equal to the current state output by said storage element; and wherein said counter is initialized when the input signal is equal to the current state output by said storage element.

15. The glitch filter according to claim 13 wherein a number of bits used for said counter and said digital delay comparator is based upon a range of the maximum glitch width.

16. The glitch filter according to claim 13 wherein if the programmable digital value is zero, the input signal is provided at the output of the multiplexer.

17. The glitch filter according to claim 13 wherein if the programmable digital value is not zero, the current value output by said storage element is provided at the output of said multiplexer.

18. The glitch filter according to claim 13 wherein the programmable delay is independent of a technology used to implement the glitch filter.

19. A method for filtering glitches comprising:
    storing a current state to be used as a final output;
    comparing the current state with an input signal;
    enabling a programmable delay whenever the input signal is different from the stored current state;
    initializing the programmable delay whenever the input signal is the same as the stored current state; and
    making the stored current state equal to the input signal if the programmed delay is complete.

20. The method according to claim 19 further comprising providing the programmable delay by:
    counting clock pulses;
    comparing the counted clock pulses with a digital value corresponding to the maximum glitch width; and
    generating a signal indicating completion of the programmed delay when the counted clock pulses become equal to the digital value.

21. The method according to claim 20 wherein counting clock pulses comprises enabling counting clock pulses only if the input signal is not equal to the stored current state and initializing counting clock pulses whenever the input signal is equal to the stored output state.

22. The method according to claim 20 wherein the filtering of glitches is enabled only when the digital value is non-zero; and wherein the filtering of glitches is disabled when the digital value is zero.

* * * * *